United States Patent
Kajiwara et al.

(10) Patent No.: US 10,109,715 B2
(45) Date of Patent: Oct. 23, 2018

(54) SEMICONDUCTOR DEVICE

(71) Applicant: Kabushiki Kaisha Toshiba, Minato-ku (JP)

(72) Inventors: Yosuke Kajiwara, Yokohama (JP); Kentaro Ikeda, Kawasaki (JP); Hisashi Saito, Yokohama (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/392,210

(22) Filed: Dec. 28, 2016

(65) Prior Publication Data

US 2017/0278934 A1 Sep. 28, 2017

(30) Foreign Application Priority Data

Mar. 23, 2016 (JP) .................................. 2016-058494

(51) Int. Cl.
| | |
|---|---|
| *H01L 27/088* | (2006.01) |
| *H01L 29/417* | (2006.01) |
| *H01L 29/778* | (2006.01) |
| *H01L 23/535* | (2006.01) |
| *H01L 29/423* | (2006.01) |

(Continued)

(52) U.S. Cl.
CPC ........ *H01L 29/4175* (2013.01); *H01L 23/535* (2013.01); *H01L 29/42316* (2013.01); *H01L 29/7786* (2013.01); *H01L 29/2003* (2013.01); *H01L 29/205* (2013.01)

(58) Field of Classification Search
CPC combination set(s) only.
See application file for complete search history.

(56) References Cited

U.S. PATENT DOCUMENTS 6,317,305 B1 * 11/2001 Dedic .................. H01L 27/0266
257/386
9,484,421 B2 * 11/2016 Kajiwara .............. H01L 23/535
(Continued)

FOREIGN PATENT DOCUMENTS

| JP | 2009-124002 | 6/2009 |
| JP | 2010-182741 | 8/2010 |

(Continued)

*Primary Examiner* — Telly Green
(74) *Attorney, Agent, or Firm* — Oblon, McClelland, Maier & Neustadt, L.L.P.

(57) ABSTRACT

A semiconductor device according to an embodiment includes: a substrate having a first plane and a second plane provided on the opposite side of the first plane; a first nitride semiconductor layer provided on the first plane; source electrodes provided on the first nitride semiconductor layer; drain electrodes provided on the first nitride semiconductor layer, each of the drain electrodes provided between the source electrodes; gate electrodes provided on the first nitride semiconductor layer, each of the gate electrodes provided between each of the source electrodes and each of the drain electrodes; a first wire provided on the second plane and electrically connected to the source electrodes; a second wire electrically connected to the drain electrodes; a third wire provided on the second plane and electrically connected to the gate electrodes; and an insulating interlayer provided between the first nitride semiconductor layer and the second wire.

13 Claims, 9 Drawing Sheets

(51) Int. Cl.
*H01L 29/20* (2006.01)
*H01L 29/205* (2006.01)

(56) References Cited

U.S. PATENT DOCUMENTS

| | | | |
|---|---|---|---|
| 2008/0079023 A1* | 4/2008 | Hikita | H01L 29/1066 257/192 |
| 2009/0079446 A1* | 3/2009 | Chatterjee | G01R 31/2621 324/719 |
| 2009/0140295 A1 | 6/2009 | Kaya et al. | |
| 2010/0038687 A1* | 2/2010 | Klaus | H01L 21/31105 257/288 |
| 2011/0062527 A1* | 3/2011 | Shino | H01L 21/82381 257/369 |
| 2011/0114967 A1* | 5/2011 | Hikita | H01L 29/1066 257/76 |
| 2011/0241126 A1* | 10/2011 | Herberholz | H01L 29/0692 257/401 |
| 2013/0069114 A1* | 3/2013 | Simin | H01L 29/4175 257/192 |
| 2013/0119486 A1* | 5/2013 | Kaibara | H01L 23/4824 257/411 |
| 2013/0126893 A1* | 5/2013 | Tanaka | H01L 29/2003 257/76 |
| 2013/0313653 A1* | 11/2013 | Brech | H01L 29/42372 257/379 |
| 2014/0092638 A1* | 4/2014 | Nishimori | H01L 29/41725 363/17 |
| 2014/0252368 A1* | 9/2014 | Lee | H01L 29/66462 257/76 |
| 2015/0263107 A1* | 9/2015 | Kobayashi | H01L 29/404 257/367 |
| 2016/0087052 A1* | 3/2016 | Kajiwara | H01L 23/535 257/401 |

FOREIGN PATENT DOCUMENTS

| | | |
|---|---|---|
| JP | 5707413 | 4/2015 |
| JP | 2016-63167 | 4/2016 |
| WO | WO 2012/023556 A1 | 2/2012 |

* cited by examiner

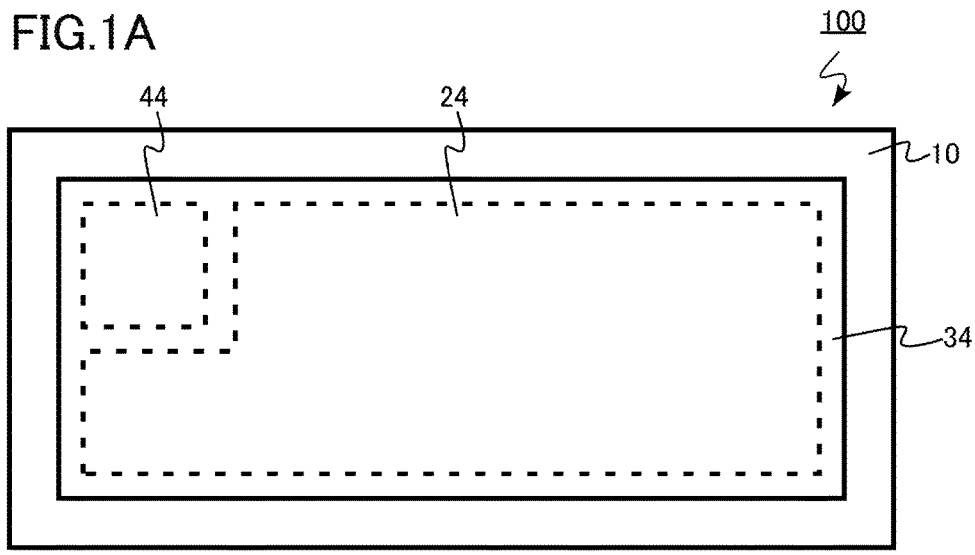
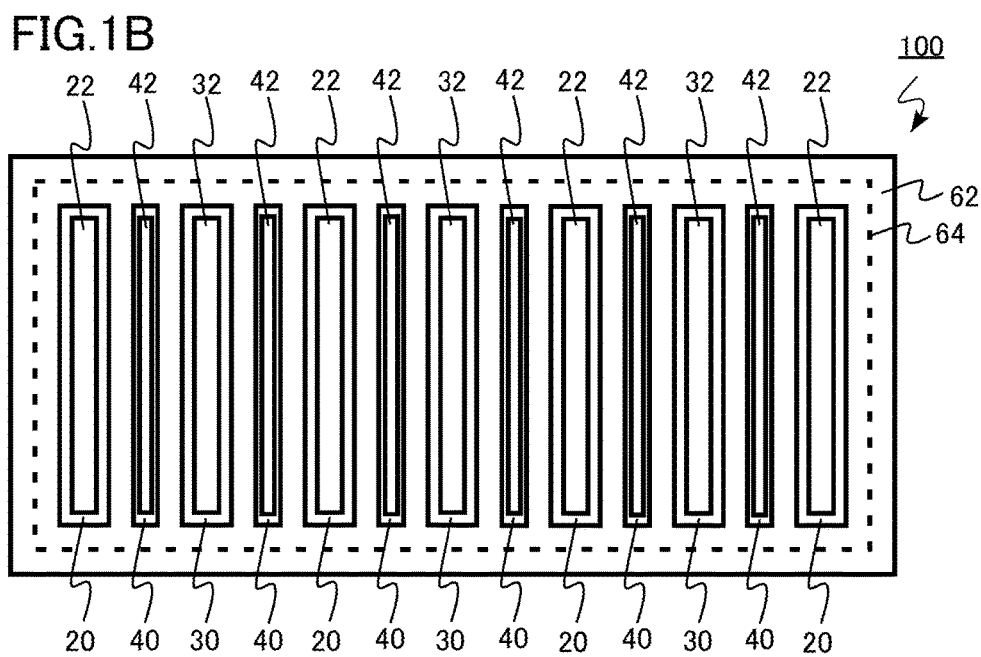

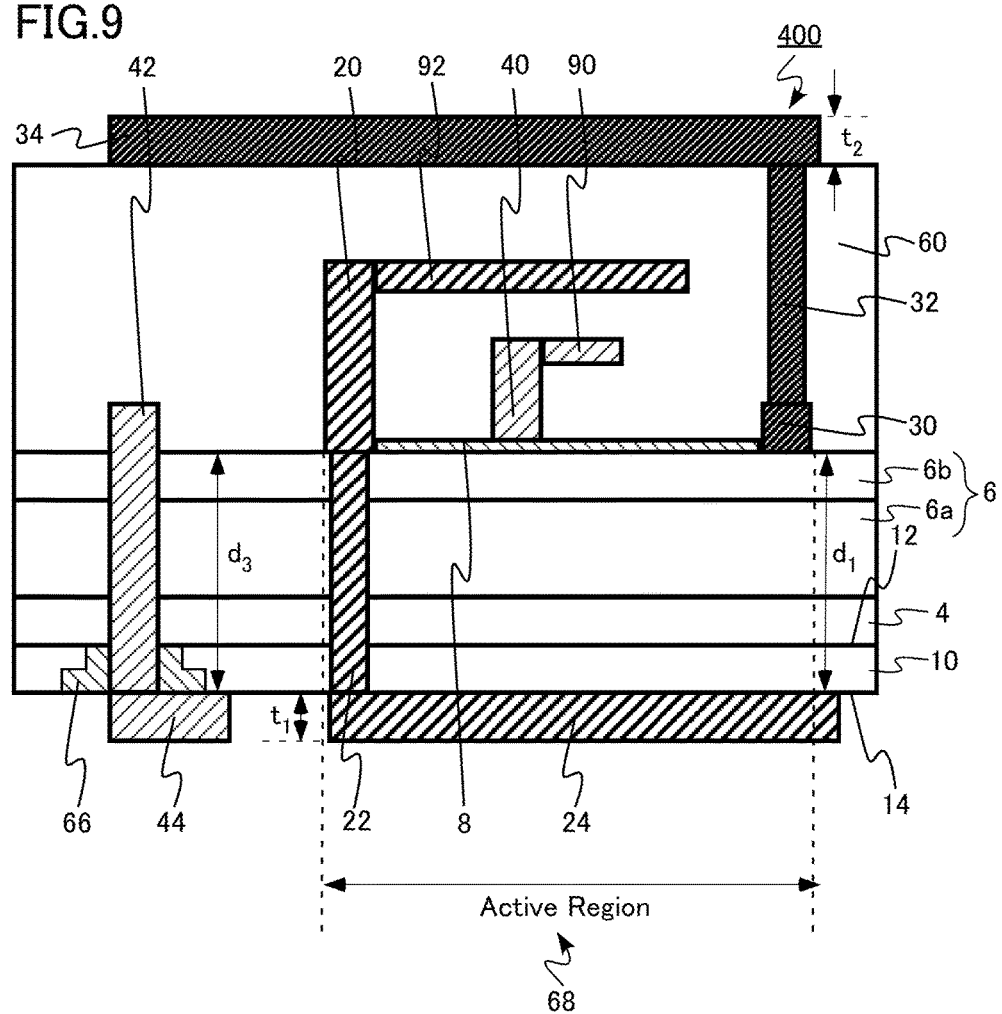

SEMICONDUCTOR DEVICE

CROSS-REFERENCE TO RELATED APPLICATION

This application is based upon and claims the benefit of priority from Japanese Patent Application No. 2016-058494, filed on Mar. 23, 2016, the entire contents of which are incorporated herein by reference.

FIELD

Embodiments described herein relate generally to a semiconductor device.

BACKGROUND

Nitride-based semiconductor materials have high breakdown field strength and high electron mobility and thus are expected to be applied to power-electronics semiconductor devices, high-frequency power semiconductor devices, or the like.

In a horizontal power-electronics semiconductor device, it is preferable that a gate width be large for driving with a large current. In this case, a multi-finger structure is preferably used. Here, since a horizontal power-electronics semiconductor device having a multi-finger structure has a large gate width and thus size is increased, there is demand for a decrease in size.

BRIEF DESCRIPTION OF THE DRAWINGS

FIGS. 1A and 1B are schematic top views of a semiconductor device 100 according to a first embodiment;

FIG. 9 is a schematic cross-sectional view of a principal part of a semiconductor device 400 according to a fourth embodiment.

DETAILED DESCRIPTION

Figure 2:
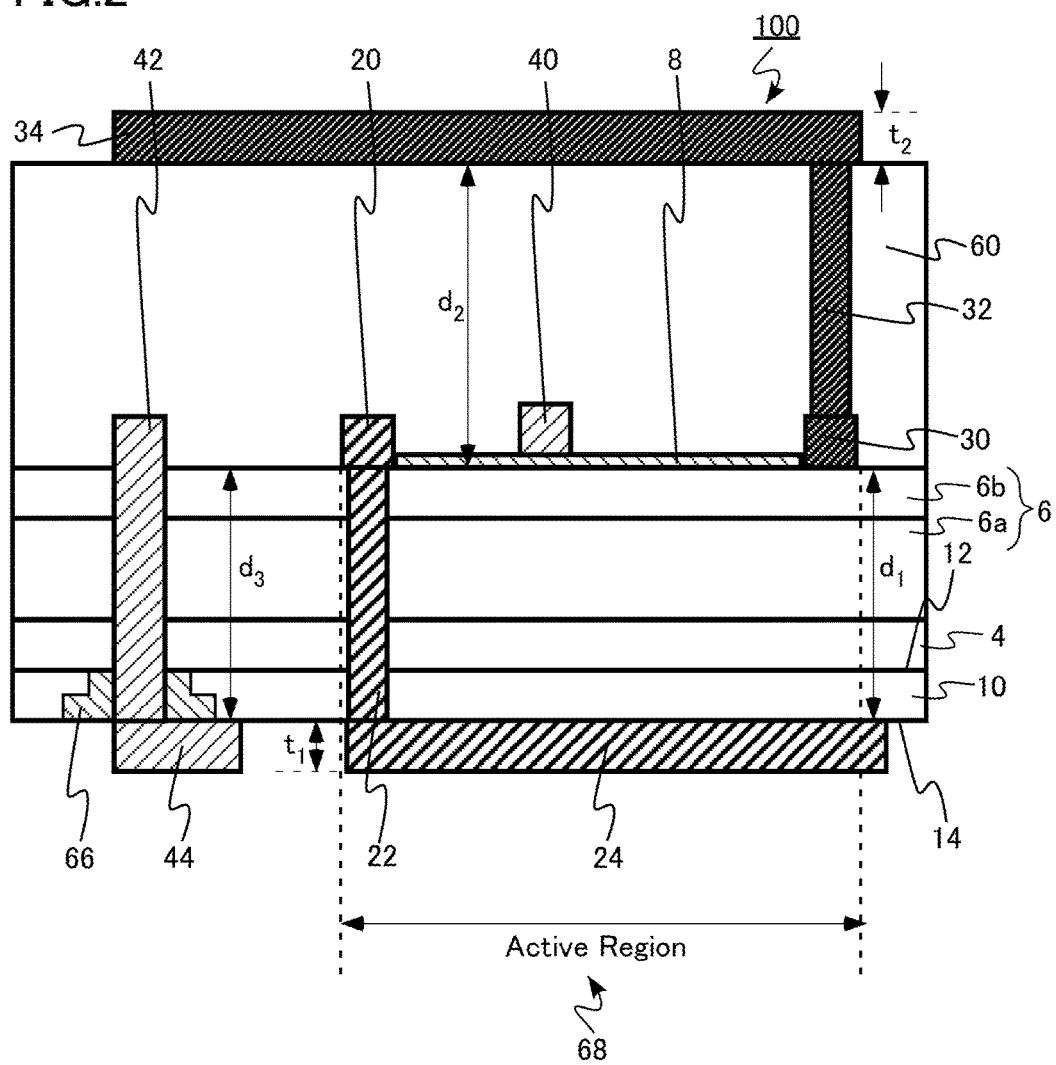
FIG. 2 is a schematic cross-sectional view of a principal part of the semiconductor device 100 according to the first embodiment.

Hereinafter, embodiments of the present invention will be described with reference to the accompanying drawings.

In this specification, in order to describe positional relationships of components and the like, an upward direction in the drawings is referred to as "upper" and a downward direction in the drawings is referred to as "lower." In this specification, the concepts of "upper" and "lower" does not necessarily indicate a relationship with the gravitational direction.

First Embodiment

A semiconductor device according to the embodiment of the present invention includes: a substrate having a first plane and a second plane provided on the opposite side of the first plane; a first nitride semiconductor layer provided on the first plane; a plurality of source electrodes provided on the first nitride semiconductor layer; a plurality of drain electrodes provided on the first nitride semiconductor layer, each of the drain electrodes provided between the source electrodes; a plurality of gate electrodes provided on the first nitride semiconductor layer, each of the gate electrodes provided between each of the source electrodes and each of the drain electrodes; a first wire provided on the second plane and electrically connected to the source electrodes; a second wire electrically connected to the drain electrodes, the source electrodes, the drain electrodes, and the gates electrode being disposed in an active region, the active region provided between the first wire and the second wire; a third wire provided on the second plane and electrically connected to the gate electrodes; and an insulating interlayer provided between the first nitride semiconductor layer and the second wire.

FIGS. 1A and 1B are schematic top views of a semiconductor device 100 according to this embodiment. FIG. 1A is a schematic top view illustrating positional relationships of a substrate 10, a first wire 24, a second wire 34, and a third wire 44 in the semiconductor device 100 according to this embodiment. FIG. 1B is a schematic view illustrating an electrode structure of the semiconductor device 100 according to this embodiment. FIG. 2 is a schematic cross-sectional view of a principal part of the semiconductor device 100 according to this embodiment.

The semiconductor device according to this embodiment is a high electron mobility transistor (HEMT) formed of nitride semiconductor such as GaN (gallium nitride), AlGaN (aluminum gallium nitride), or InGaN (indium gallium nitride). The electrode structure of the semiconductor device 100 according to this embodiment is a multi-finger structure.

The semiconductor device 100 includes a first nitride semiconductor layer 6, a second nitride semiconductor layer 4, a gate insulating film 8, the substrate 10, a source electrode 20, a first connecting portion 22, the first wire 24, a drain electrode 30, a second connecting portion 32, the second wire 34, a gate electrode 40, a third connecting portion 42, the third wire 44, an insulating interlayer 60, an element isolation region 62, an insulating layer 66, and an active region 68.

The substrate 10 has a first plane 12 and a second plane 14 provided on the opposite side of the first plane 12 and is, for example, a silicon (Si) substrate. For example, a sapphire substrate or a silicon carbide (SiC) substrate can be used as well as the Si substrate.

The first nitride semiconductor layer 6 is provided on the first plane 12. The first nitride semiconductor layer 6 includes a first semiconductor layer 6a and a second semiconductor layer 6b provided on the first semiconductor layer 6a. The bandgap of the second semiconductor layer 6b is larger than the bandgap of the first semiconductor layer 6a.

The first semiconductor layer 6a is formed of, for example, undoped $Al_XGa_{1-X}N$ ($0 \le X \le 1$). More specifically, the first semiconductor layer 6a is formed of undoped GaN. The film thickness of the first semiconductor layer 6a is, for example, equal to or greater than 0.5 μm and equal to or less than 3 μm. The second semiconductor layer 6b is formed of, for example, undoped $Al_YGa_{1-Y}N$ (0<Y≤1 and X<Y). More specifically, the second semiconductor layer 6b is formed of undoped $Al_{0.2}Ga_{0.8}N$. The film thickness of the second semiconductor layer 6b is, for example, equal to or greater than 15 nm and equal to or less than 50 nm.

A heterojunction interface is formed between the first semiconductor layer 6a and the second semiconductor layer 6b. When the semiconductor device 100 operates in an ON state, two-dimensional electron gas (2DEG) is formed in the heterojunction interface and functions as a carrier.

The second nitride semiconductor layer (buffer layer) 4 is provided between the substrate 10 and the first nitride semiconductor layer 6. By providing the second nitride semiconductor layer 4, lattice mismatch between the substrate 10 and the first nitride semiconductor layer 6 is relaxed and the first nitride semiconductor layer 6 having high crystallinity is formed. Accordingly, it is possible to realize a high-performance semiconductor device. The second nitride semiconductor layer 4 has, for example, a multi-layered structure of aluminum gallium nitride ($Al_WGa_{1-W}N$ (0<W<1)).

The semiconductor device 100 includes a plurality of source electrodes 20 provided on the first nitride semiconductor layer 6 (the second semiconductor layer 6b), a plurality of drain electrodes 30 provided on the first nitride semiconductor layer 6, and a plurality of gate electrodes 40 provided on the first nitride semiconductor layer 6. Each of the drain electrodes 30 are provided between the source electrodes 20. Each of the gate electrodes 40 are provided between each of the source electrodes 20 and each of the drain electrodes 30.

In order to relax electric field concentration at the time of application of a voltage and to suppress a current collapse, it is preferable that the source electrodes 20 be electrically connected to the substrate 10 to have the same electric potential as the substrate 10.

The first wire 24 is provided on the second plane 14. The first wire 24 is electrically connected to the source electrodes 20. In the semiconductor device 100 according to this embodiment, for example, the case in which "the first wire 24 is provided on the second plane 14" includes a case in which the first wire 24 and the second plane 14 are in direct contact with each other and a case in which the first wire 24 and the second plane 14 are in indirect contact with each other by providing an intermediate layer or the like between the first wire 24 and the second plane 14.

Figure 3:
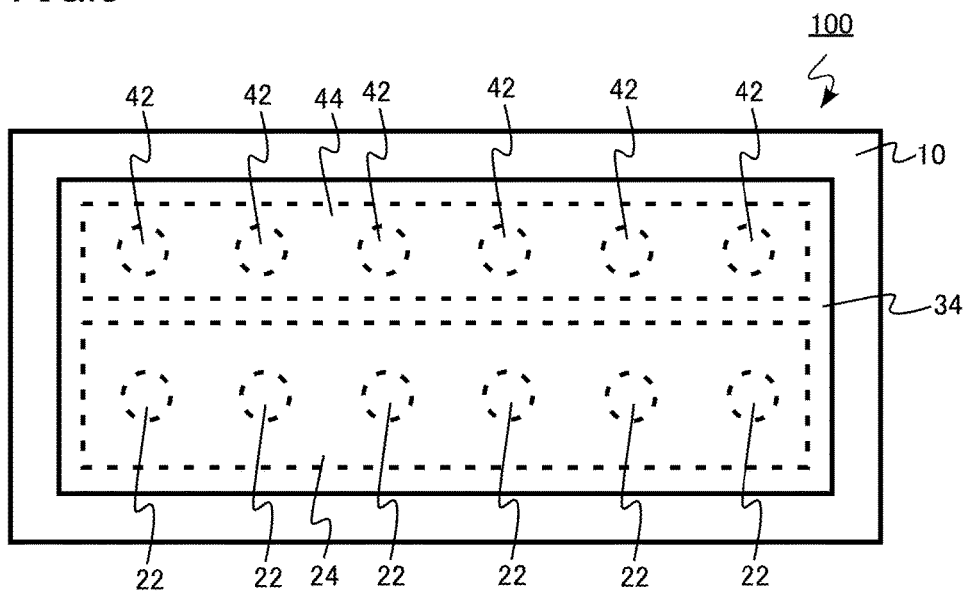
FIG. 3 is a schematic top view illustrating a first connecting portion 22 and a third connecting portion 42 of the semiconductor device 100 according to the first embodiment.

FIG. 3 is a schematic top view illustrating the first connecting portion 22 and the third connecting portion 42 in the semiconductor device 100 according to the first embodiment.

The first connecting portion 22 is provided between the first wire 24 and the source electrodes 20. The first connecting portion 22 is electrically connected to the first wire 24 to the source electrodes 20. Here, when a plurality of wires electrically connected to the source electrodes 20 are provided, a wire in which a largest inscribed circle can be described in a plane parallel to the first nitride semiconductor layer 6 is defined as the first wire 24. The other wires are defined as the first connecting portions 22.

A plurality of first connecting portions 22 may be provided to be separated from each other between the source electrodes 20 and the first wire 24. A single first connecting portion 22 may be provided between the source electrodes 20 and the first wire 24.

The second wire 34 is provided above the active region 68. Or an active region 68 is provided between the first wire 24 and the second wire 34. The second wire 34 is electrically connected to the drain electrodes 30. The active region 68 refers to a region in which a transistor is formed. Specifically, the active region 68 refers to a region in which a transistor operates and where the source electrode 20, the drain electrode 30, and the gate electrode 40 are disposed. Or the source electrodes 20, the drain electrodes 30, and the gate electrodes 40 are disposed in an active region 68.

By providing the second wire 34 on a part, not the entire surface, of the active region 68, the second wire 34 may be decreased in size. By decreasing the size of the second wire 34, it is possible to decrease parasitic capacitance between the nitride semiconductor layer and the second wire 34. The second wire 34 may be provided on the entire surface of the active region 68.

The second connecting portion 32 is provided between the second wire 34 and the drain electrodes 30. The second connecting portion 32 is electrically connected to the second wire 34 and the drain electrodes 30. Here, when a plurality of wires electrically connected to the drain electrodes 30 are provided, a wire in which a largest inscribed circle can be described in a plane parallel to the first nitride semiconductor layer 6 is defined as the second wire 34. The other wires are defined as the second connecting portions 32.

A plurality of second connecting portions 32 may be provided to be separated from each other between the drain electrodes 30 and the second wire 34. A single second connecting portion 32 may be provided between the drain electrodes 30 and the second wire 34.

The third wire 44 is provided on the second plane 14. The third wire 44 is electrically connected to the gate electrodes 40.

The third connecting portion 42 is provided between the third wire 44 and the gate electrodes 40. The third connecting portion 42 is electrically connected to the third wire 44 and the gate electrodes 40. Here, when a plurality of wires electrically connected to the gate electrodes 40 are provided, a wire in which a largest inscribed circle can be described in a plane parallel to the first nitride semiconductor layer 6 is defined as the third wire 44. The other wires are defined as the third connecting portions 42.

A plurality of third connecting portions 42 may be provided to be separated from each other between the gate electrodes 40 and the third wire 44. A single third connecting portion 42 may be provided between the gate electrodes 40 and the third wire 44.

It is preferable that the source electrodes 20 and the drain electrodes 30 include, for example, a stacked structure of titanium (Ti) and aluminum (Al). The gate electrodes 40 are preferably formed of, for example, titanium nitride (TiN), molybdenum nitride (MoN), tungsten nitride (WN), tantalum nitride (TaN), or nickel (Ni). The first connecting portion 22, the second connecting portion 32, and the third connecting portion 42 preferably have, for example, a stacked structure of Ti and Al. The first wire 24, the second wire 34, and the third wire 44 are preferably formed of, for example, Al, copper (Cu), or gold (Au).

The insulating interlayer 60 are provided around the first nitride semiconductor layer 6, the source electrodes 20, the first connecting portion 22, the first wire 24, the drain electrodes 30, the second connecting portion 32, the second wire 34, the gate electrodes 40, the third connecting portion 42, and the third wire 44. Alternatively, the insulating interlayer 60 is provided between the first nitride semiconductor layer 6 and the second wire 34. It is preferable that the insulating interlayer 60 be formed of a polyimide film or a benzocyclobutene (BCB) film, because the specific dielectric constant thereof is small and parasitic capacitance between the substrate and the source electrode is small.

The insulating layer 66 is provided between the third connecting portion 42 and the substrate 10. The insulating layer 66 insulates the third connecting portion 42 (the third wire 44) and the substrate 10 from each other. For example, silicon nitride (SiN), aluminum nitride (AlN), silicon oxide (SiO$_2$), or aluminum oxide (Al$_2$O$_3$) can be preferably used as the material of the insulating layer 66.

The gate insulating film 8 is provided between the gate electrodes 40 and the first nitride semiconductor layer 6. For example, silicon nitride (SiN), aluminum nitride (AlN), silicon oxide (SiO$_2$), or aluminum oxide (Al$_2$O$_3$) can be preferably used as the material of the gate insulating film 8. The gate insulating film 8 may not be provided.

The semiconductor device 100 may be provided with an element isolation boundary 64. In this case, an element isolation region 62 is provided on the nitride semiconductor layer outside the element isolation boundary 64. The element isolation region 62 is formed, for example, by implanting Ar ions into the nitride semiconductor layer. Alternatively, the element isolation region 62 may be formed by burying an insulator material such as a polyimide film or a benzocyclobutene (BCB) film having a low specific dielectric constant in the nitride semiconductor layer. The active region 68 is provided inside the element isolation boundary 64.

It is preferable that a film thickness $t_1$ of the first wire 24 be larger than a film thickness $t_2$ of the second wire 34.

If a specific dielectric constant of the first nitride semiconductor layer 6 is defined as $\varepsilon_f$, the film thickness of the first nitride semiconductor layer 6 is defined as $d_f$, the specific dielectric constant of the insulating interlayer 60 is defined as $\varepsilon_d$, and the film thickness of the insulating interlayer 60 is defined as $d_d$, it is preferable that the ratio of $\varepsilon_f$ to $d_f$ be larger than the ratio of $\varepsilon_d$ to $d_d$, that is, $(\varepsilon_f/d_f) > (\varepsilon_d/d_d)$ is established. In this embodiment, if the specific dielectric constant of the second nitride semiconductor layer 4 is defined as $\varepsilon_a$, the film thickness of the second nitride semiconductor layer 4 is defined as $d_a$, the specific dielectric constant of the first semiconductor layer 6a is defined as $\varepsilon_b$, the film thickness of the first semiconductor layer 6a is defined as $d_b$, the specific dielectric constant of the second semiconductor layer 6b is defined as $\varepsilon_c$, and the film thickness of the second semiconductor layer 6b is defined as $d_c$, it is also preferable that $(\varepsilon_a\varepsilon_b\varepsilon_c/(d_a\varepsilon_b\varepsilon_c+d_b\varepsilon_a\varepsilon_c+d_c\varepsilon_a\varepsilon_b)) > (\varepsilon_d/d_d)$ be established.

Figure 4:
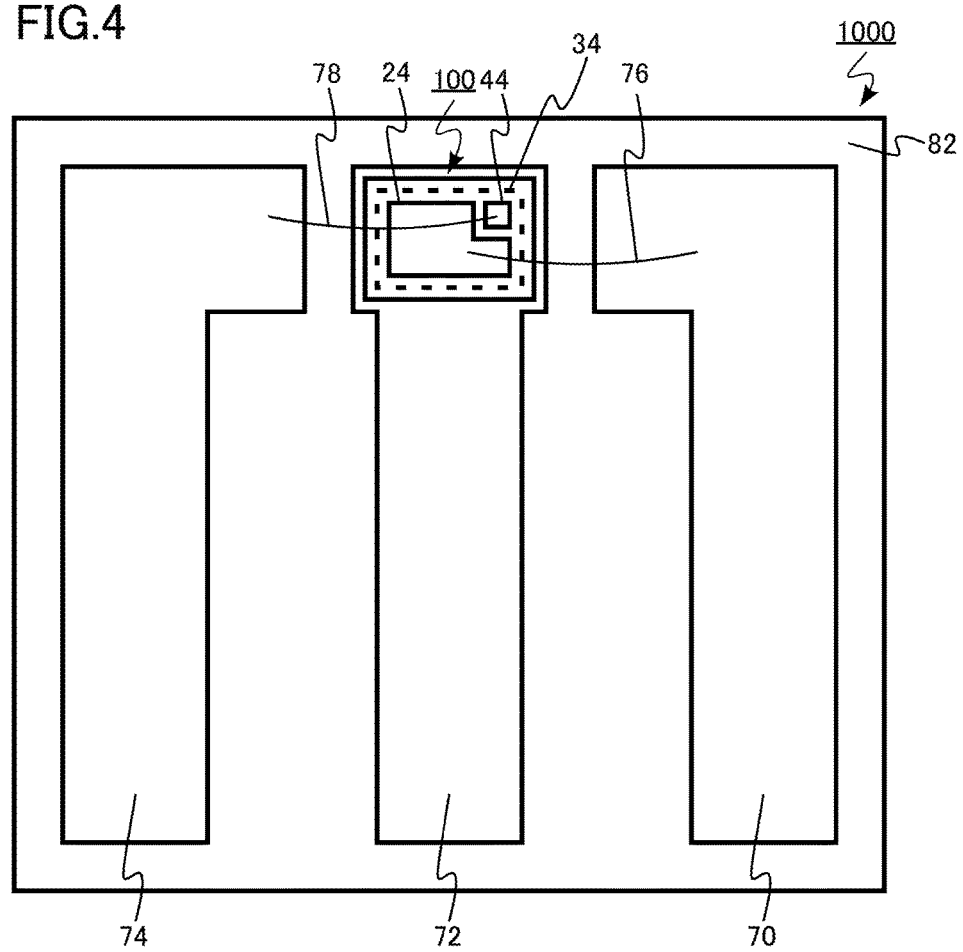
FIG. 4 is a schematic top view of a semiconductor package 1000 employing the semiconductor device 100 according to the first embodiment.

FIG. 4 is a schematic top view of a semiconductor package 1000 employing the semiconductor device 100 according to this embodiment.

The semiconductor package 1000 includes the semiconductor device 100, a source terminal (a first terminal) 70, a drain terminal (a second terminal) 72, a gate terminal (a third terminal) 74, a first bonding wire 76, a second bonding wire 78, and a package substrate 82. The source terminal 70, the drain terminal 72, and the gate terminal 74 are provided on the package substrate 82.

The semiconductor device 100 is disposed on the package substrate 82 so that the second wire 34 is electrically connected to the drain terminal 72. Accordingly, the first wire 24 and the third wire 44 are disposed on the top surface of the semiconductor package 1000. A conductive paste or the like may be provided between the second wire 34 and the drain terminal 72. The first wire 24 and the source terminal 70 are electrically connected to each other by the first bonding wire 76. The third wire 44 and the gate terminal 74 are electrically connected to each other by the second bonding wire 78. The components for electrically connecting the first wire 24 and the source terminal 70 or electrically connecting the third wire 44 and the gate terminal 74 is not limited to the bonding wire.

Functions and effects of this embodiment will be described below.

Figure 5:
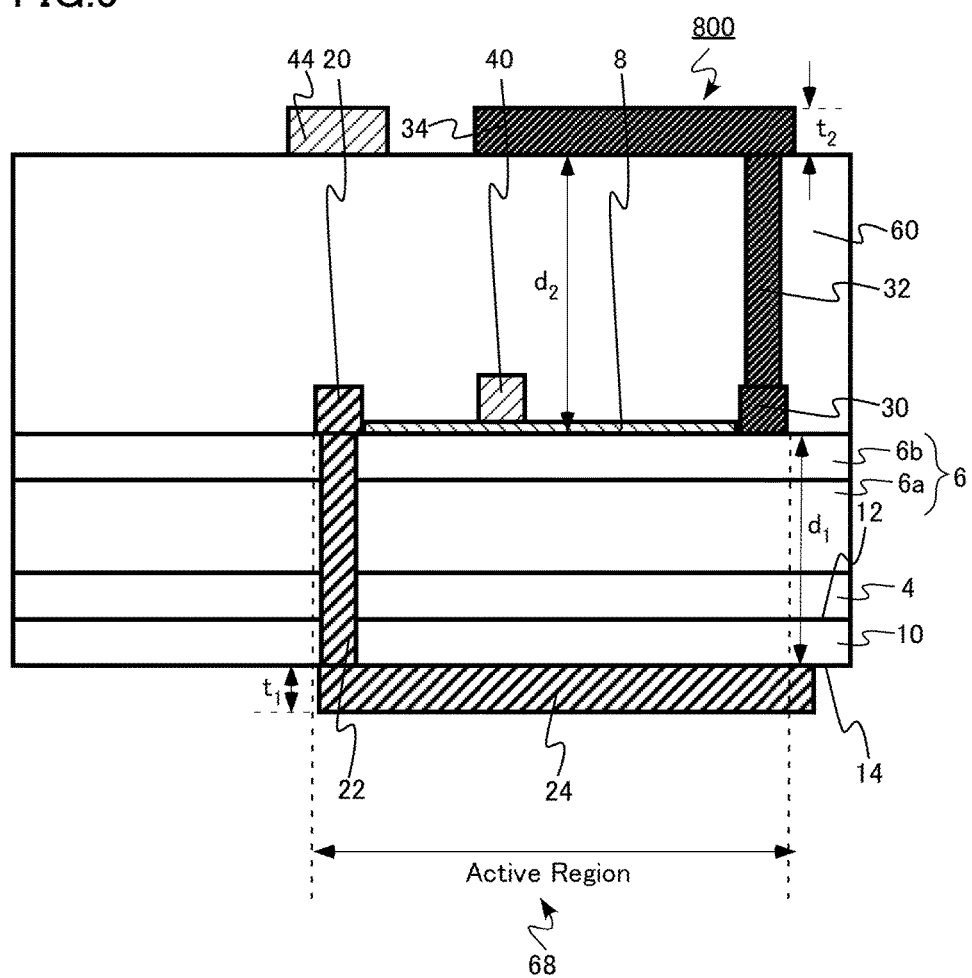
FIG. 5 is a schematic cross-sectional view of a principal part of a semiconductor device 800 according to a comparative example of the first embodiment.
Figure 6:
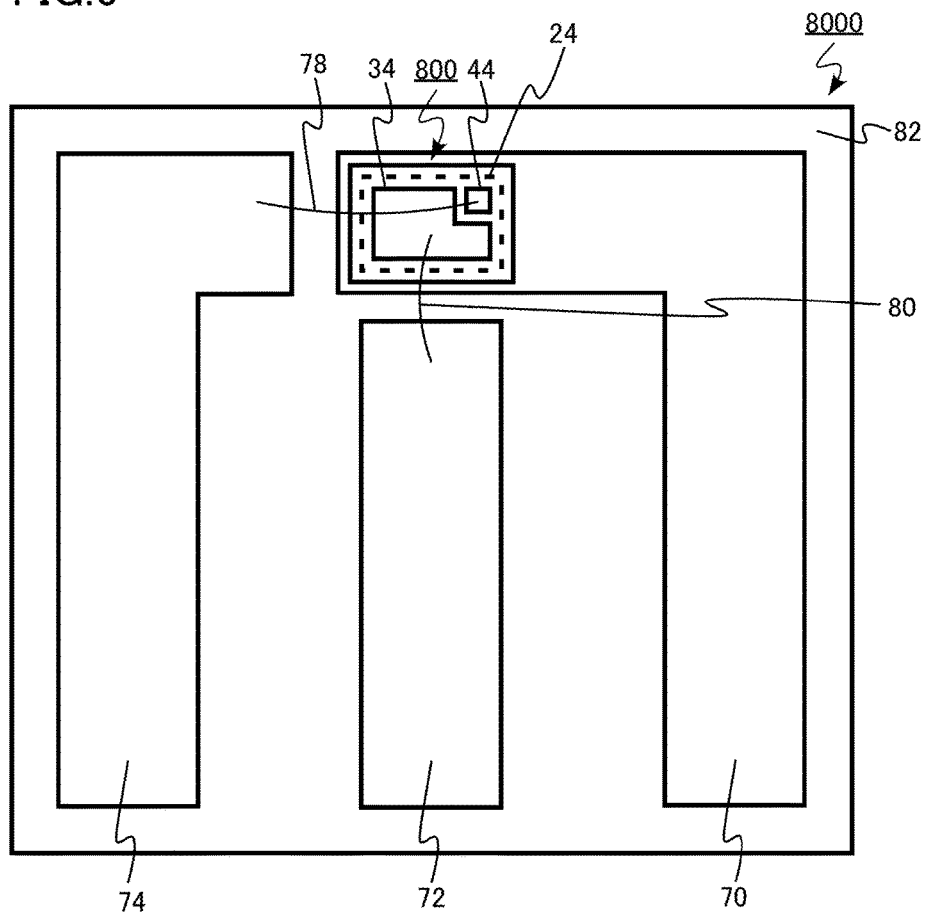
FIG. 6 is a schematic top view of a semiconductor package 8000 employing the semiconductor device 800 according to the comparative example of the first embodiment.

FIG. 5 is a schematic cross-sectional view of a principal part of a semiconductor device 800 according to a comparative example of this embodiment. FIG. 6 is a schematic top view of a semiconductor package 8000 employing the semiconductor device 800 according to the comparative example of this embodiment.

In the semiconductor device 800, the second wire 34 and the third wire 44 are provided above the active region 68 and the first wire 24 is provided on the second plane 14. Accordingly, in the semiconductor package 8000 illustrated in FIG. 6, the drain terminal 72 and the second wire 34 are connected by a third bonding wire 80 on the top surface of the semiconductor package 8000. When driving the semiconductor device, a high voltage is applied to the drain electrode. Accordingly, when a semiconductor package is manufactured, an insulating property between the second wire 34 electrically connected to the drain electrode and the first wire 24, and an insulating property between the second wire 34 and the third wire 44, has to be maintained.

In the semiconductor device 100 according to this embodiment, the second wire 34 is provided above the active region 68, and the first wire 24 and the third wire 44 are provided on the second plane 14. That is, since the first wire 24 and the third wire 44 are provided on the plane other than that of the second wire 34, it is possible to easily maintain the insulating property of the second wire 34 from the first wire 24 and the third wire 44 and thus to provide the semiconductor device 100 with high safety.

Since the second wire 34 is provided above the active region 68, it is possible to provide a semiconductor device 100 with a smaller size in comparison with a case in which the second wire 34 is disposed on the element isolation region 62.

Since the source electrode 20 preferably has the same electric potential as the substrate 10, large source-drain capacitance of a horizontal power-electronics semiconductor device having a multi-finger structure is mainly attributed to parasitic capacitance between the drain electrodes 30, the second connecting portion 32 or the second wire 34, and the substrate 10. Particularly, since the second wire 34 has a large area, the second wire 34 greatly contributes to the parasitic capacitance.

The semiconductor device is expected to be applied to a high-frequency power semiconductor device or the like. However, there is a problem in that a switching loss due to charge and discharge of the parasitic capacitance increases in a high-frequency operation, and thus a semiconductor device with high breakdown field strength and high electron mobility cannot be provided.

In the semiconductor device 100 according to this embodiment, the insulating interlayer 60 is provided to be interposed between the second wire 34 and the substrate 10. Accordingly, the parasitic capacitance between the second wire 34 and the substrate 10 is decreased.

Accordingly, a distance $d_2$ between the first nitride semiconductor layer 6 and the second wire 34 increases and thus the second connecting portion 32 is lengthened and drain resistance increases. However, in the semiconductor device 100, for the purpose of a high-speed operation, a decrease in parasitic capacitance between the second wire 34 and the substrate 10 is more preferable than a decrease in drain resistance.

On the other hand, in order to drive the semiconductor device with a large current, it is preferable that source resistance be decreased. By setting the film thickness $t_1$ of the first wire 24 to be larger than the film thickness $t_2$ of the second wire 34, it is possible to decrease the source resistance.

If $(\varepsilon_f/d_f)>(\varepsilon_d/d_d)$ is satisfied, it means that the parasitic capacitance between the second wire 34 and the substrate 10 is smaller than the capacitance based on the nitride semiconductor layer, which is preferable.

According to the semiconductor device of the present embodiment, a semiconductor device with a decreased size is provided.

Second Embodiment

A semiconductor device according to the embodiment includes: a substrate having a first plane and a second plane provided on the opposite side of the first plane; a first nitride semiconductor layer provided on the first plane; a plurality of source electrodes provided on the first nitride semiconductor layer; a plurality of drain electrodes provided on the first nitride semiconductor layer, each of the drain electrodes provided between the source electrodes; a plurality of gate electrodes provided on the first nitride semiconductor layer, each of the gate electrodes provided between each of the source electrodes and each of the drain electrodes; a first wire provided on the second plane and electrically connected to the source electrodes; a second wire electrically connected to the drain electrodes, the source electrodes, the drain electrodes, and the gate electrodes being disposed in an active region, the active region provided between the first wire and the second wire; a third wire provided on the first nitride semiconductor layer and electrically connected to the gate electrodes, the first nitride semiconductor layer provided between the second wire and the third wire; and an insulating interlayer provided between the first nitride semiconductor layer and the second wire.

The semiconductor device according to this embodiment is different from the semiconductor device 100 according to the first embodiment, in that the substrate 10 is not present around the third wire 44 and the third wire 44 is in direct contact with the nitride semiconductor layer. Here, the same configuration as in the first embodiment will not be repeatedly described.

Figure 7:
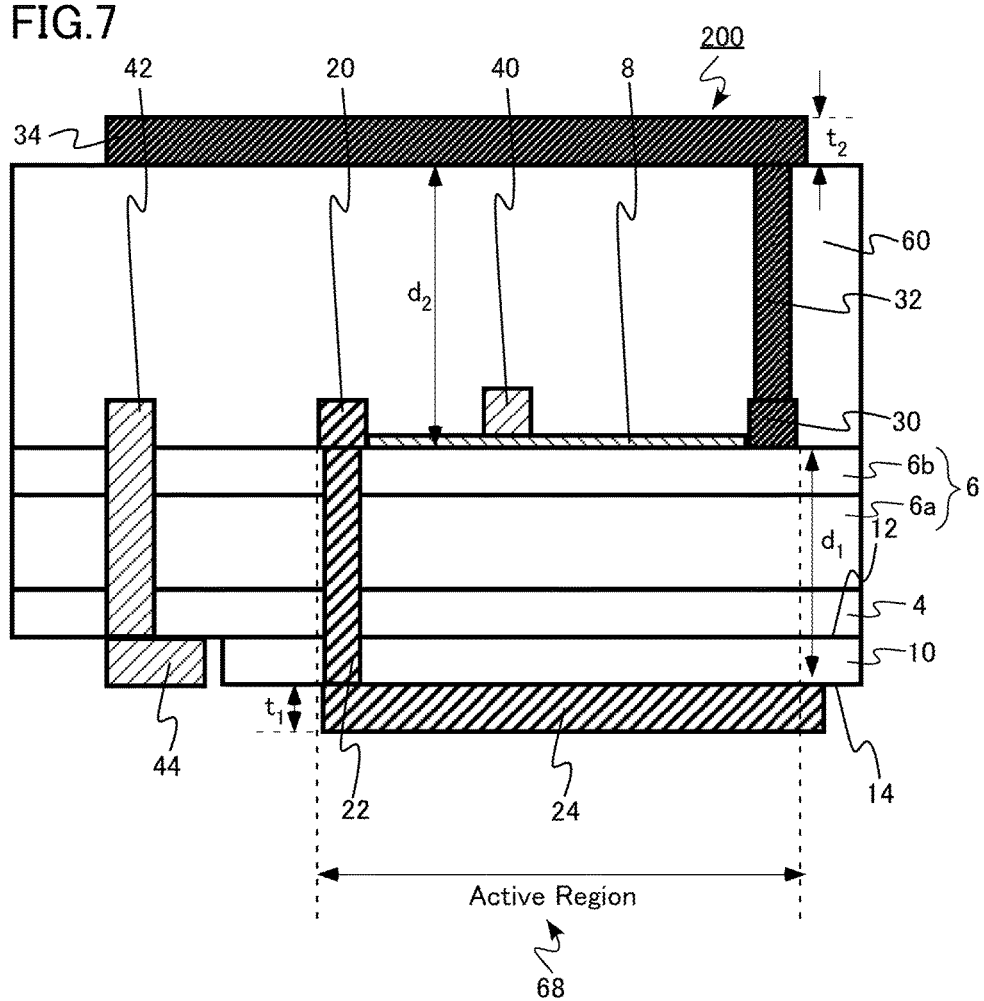
FIG. 7 is a schematic cross-sectional view of a principal part of a semiconductor device 200 according to a second embodiment.

FIG. 7 is a schematic cross-sectional view of a principal part of a semiconductor device 200 according to this embodiment.

By employing the configuration in which the substrate 10 is not present around the third wire 44 as in the semiconductor device 200 according to this embodiment, the third connecting portion 42 (the third wire 44) can be insulated from the substrate 10.

According to the semiconductor device 200 of this embodiment, a semiconductor device with a decreased size is provided.

Third Embodiment

A semiconductor device according to the embodiment is different from the semiconductor devices according to the first and second embodiments, in that the insulating interlayer 60 includes a plurality of insulating films. Here, the same configuration as in the first and second embodiments will not be repeatedly described.

Figure 8:
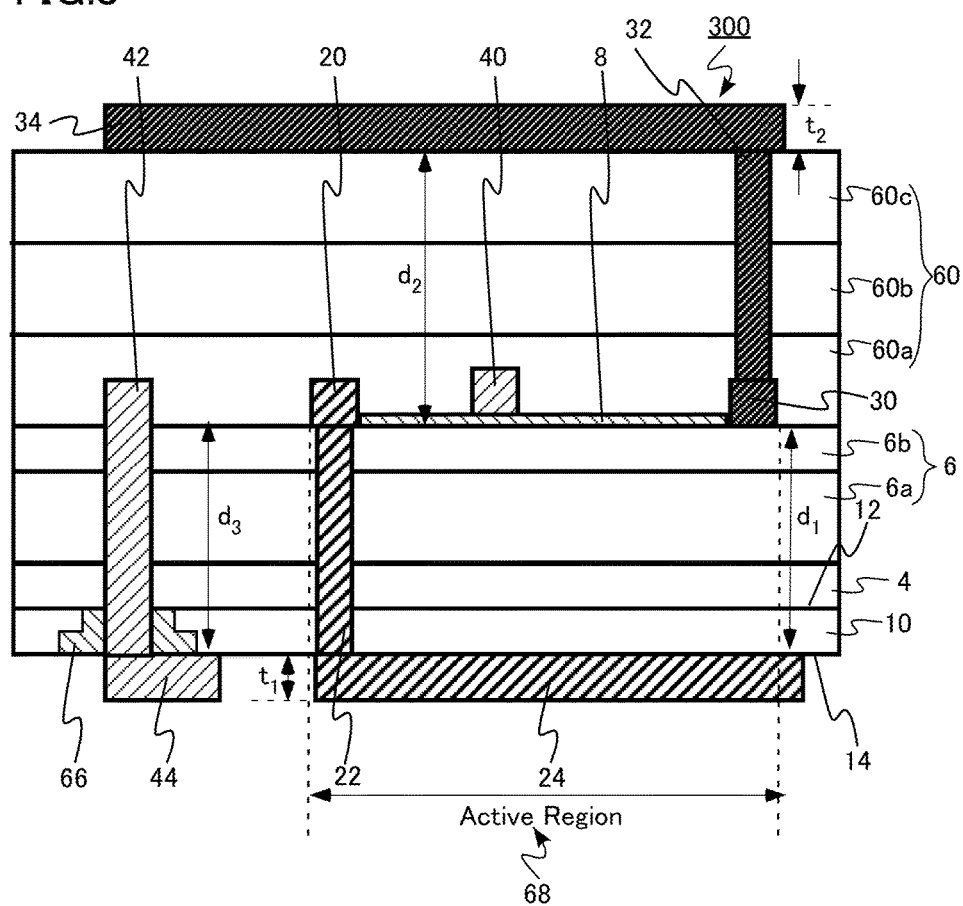
FIG. 8 is a schematic cross-sectional view of a principal part of a semiconductor device 300 according to a third embodiment.

FIG. 8 is a schematic cross-sectional view of a principal part of a semiconductor device 300 according to this embodiment.

In the semiconductor device 300 according to this embodiment, the insulating interlayer 60 includes a first insulating film 60a provided between the first nitride semiconductor layer 6 and the second wire 34, a second insulating film 60b provided between the first insulating film 60a and the second wire 34, and a third insulating film 60c provided between the second insulating film 60b and the second wire 34.

According to the semiconductor device 300 of this embodiment, since the insulating interlayer can be formed through a plurality of processes, it is particularly possible to easily manufacture the electrodes or the connecting portions of the semiconductor device 300.

According to the semiconductor device 300 of this embodiment, a semiconductor device with a decreased size capable of being easily manufactured is provided.

Fourth Embodiment

A semiconductor device 400 according to the embodiment is different from the first to third embodiments, in that the semiconductor device further includes a gate field plate electrode 90 in which one end is electrically connected to the gate electrode 40 and the other end is disposed between the gate electrode 40 and the drain electrode 30 and which is provided to be separated from the first nitride semiconductor layer 6, and a source field plate electrode 92 in which one end is electrically connected to the source electrode 20 and the other end is provided to be separated from the first nitride semiconductor layer 6 between the source electrode 20 and the drain electrode 30 above the gate field plate electrode 90. Here, the same configurations as in the first to third embodiments will not be repeatedly described.

FIG. 9 is a schematic cross-sectional view of the semiconductor device 400 according to this embodiment.

The gate field plate electrode 90 and the source field plate electrode 92 are used to relax electric field concentration in the semiconductor device 100 and to suppress a current collapse by electric field generated respectively.

According to the semiconductor device 400 of the present embodiment, a semiconductor device with a decreased size and with a suppressed current collapse is provided.

According to the semiconductor device according to at least one of the above-mentioned embodiments, since the semiconductor device includes a substrate having a first plane and a second plane provided on the opposite side of the first plane; a first nitride semiconductor layer provided on the first plane; a plurality of source electrodes provided on the first nitride semiconductor layer; a plurality of drain electrodes provided on the first nitride semiconductor layer, each of the drain electrodes provided between the source electrodes; a plurality of gate electrodes provided on the first nitride semiconductor layer, each of the gate electrodes provided between each of the source electrodes and each of the drain electrodes; a first wire provided on the second plane and electrically connected to the source electrodes; a second wire electrically connected to the drain electrodes, an active region provided between the first wire and the second wire; a third wire provided on the second plane and electrically connected to the gate electrodes; and an insulating interlayer provided between the first nitride semiconductor layer and the second wire, it is possible to provide a semiconductor device with small parasitic capacitance.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate having a first plane and a second plane provided on the opposite side of the first plane;
   a first nitride semiconductor layer provided on the first plane;
   a plurality of source electrodes provided on the first nitride semiconductor layer;
   a plurality of drain electrodes provided on the first nitride semiconductor layer, each of the drain electrodes provided between the source electrodes, the source electrodes, the drain electrodes, and a plurality of gate electrodes being disposed in an active region;
   the plurality of gate electrodes provided on the first nitride semiconductor layer, each of the gate electrodes provided between each of the source electrodes and each of the drain electrodes;
   a first wire provided on the second plane and electrically connected to the source electrodes;
   a second wire electrically connected to the drain electrodes, the active region provided between the first wire and the second wire;
   a third wire provided on the second plane and electrically connected to the gate electrodes; and
   an insulating interlayer provided between the first nitride semiconductor layer and the second wire.

2. The device according to claim 1, wherein
   a film thickness of the first wire is larger than a film thickness of the second wire.

3. The device according to claim 1, wherein
   a ratio of a specific dielectric constant of the first nitride semiconductor layer to a film thickness of the first nitride semiconductor layer is larger than a ratio of a specific dielectric constant of the insulating interlayer to a film thickness of the insulating interlayer.

4. The device according to claim 1, further comprising a first connecting portion provided between the source electrodes and the first wire, the first connecting portion being electrically connected to the source electrodes and the first wire.

5. The device according to claim 4, further comprising a plurality of the first connecting portions, the first connecting portions being electrically connected to each of the source electrodes.

6. The device according to claim 1, further comprising a second connecting portion provided between the drain electrodes and the second wire, the second connecting portion being electrically connected to the drain electrodes and the second wire.

7. The device according to claim 1, further comprising a third connecting portion provided between the gate electrodes and the third wire, the third connecting portion being electrically connected to the gate electrodes and the third wire.

8. The device according to claim 7, further comprising a plurality of the third connecting portions, the third connecting portions being electrically connected to each of the gate electrodes.

9. The device according to claim 7, further comprising an insulator provided between the substrate and the third connecting portion.

10. The device according to claim 1, wherein the first nitride semiconductor layer includes:
    a first semiconductor layer; and
    a second semiconductor layer provided on the first semiconductor layer, a bandgap of the second semiconductor layer being larger than a bandgap of the first semiconductor layer.

11. The device according to claim 1, further comprising a second nitride semiconductor layer provided between the substrate and the first nitride semiconductor layer.

12. The device according to claim 1, wherein the insulating interlayer includes a plurality of insulating films.

13. The device according to claim 1, wherein the second wire is provided above the active region.

* * * * *